Feb. 16, 1971 A. HÄHNLEIN 3,564,358
INTEGRATED CIRCUIT STRUCTURE CONTAINING MULTIPLE SANDWICH LAYERS OF MONO-CRYSTALLINE SEMICONDUCTOR AND INSULATOR MATERIAL
Filed Nov. 13, 1968
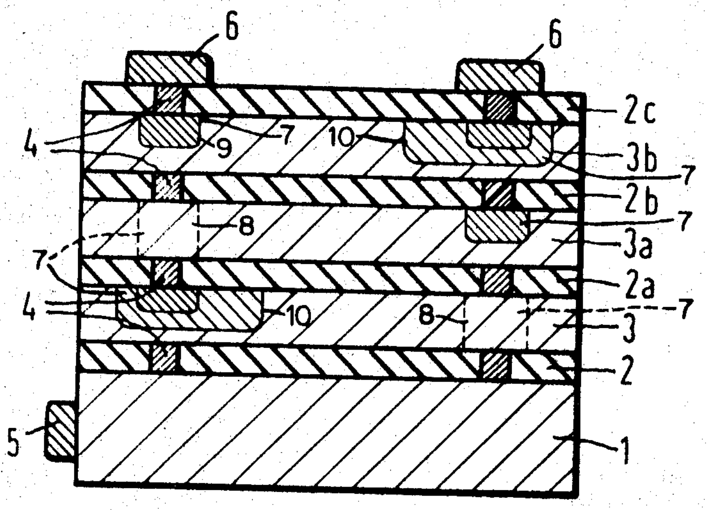
INVENTOR
ALFONS HÄHNLEIN
BY
ATTORNEY United States Patent Office 3,564,358
Patented Feb. 16, 1971

3,564,358

INTEGRATED CIRCUIT STRUCTURE CONTAINING MULTIPLE SANDWICH LAYERS OF MONO-CRYSTALLINE SEMICONDUCTOR AND INSULATOR MATERIAL

Alfons Hähnlein, Nieder-Ramstadt, Germany, assignor to Siemens Aktiengesellschaft, Berlin, Germany, a corporation of Germany Filed Nov. 13, 1968, Ser. No. 775,395
Claims priority, application Germany, Nov. 15, 1967, P 15 89 705.9
Int. Cl. H01l 19/00
U.S. Cl. 317—235 4 Claims

ABSTRACT OF THE DISCLOSURE

This is an integrated circuit structure having several silicon layers electrically isolated and capacitively decoupled from each succeeding layer by means of intermediate insulating layers of aluminium silicates, said layers being successively deposited on a silicon substrate.

BACKGROUND OF THE INVENTION

This invention relates to a structure for providing insulation between electrical components or stages on a monolithic integrated circuit.

In connection with the manufacture of monolithic integrated circuits on a semiconductor basis the problem of insulating individual components or electrical function stages has not yet been solved in a technologically simple way. Thus, integrated circuits manufactured by way of insulation diffusion, besides having production-technical disadvantages, mostly have excessively high capacitive couplings; the insulation of monocrystalline silicon islands using $SiO_2$ is extremely expensive; the technically difficult process concerning the epitaxy of silicon on corundum, amongst others, has likewise so far not been accepted on a wider basis; the reduction of the capacitive couplings by way of always further reducing the individual components is anyway restricted by technological limits.

By latest works (Electrochemical Society, June 1967, page 142*c*) it has now been confirmed that thin mono-crystalline layers of aluminum silicates can be produced epitaxially on silicon ($Al_2O_3$—85%, $SiO_2$—15%). This process is excellently suitable for the mass production of semiconductor components and, in addition thereto, prevents the diffusion of silicons.

SUMMARY OF THE INVENTION

It is an object of this invention to provide for an improvement in the insulation between electrical components or stages on a monolithic integrated structure.

The present invention is based on an arrangement in which, in the well-known way, on a silicon substrate serving as the base crystal, there is epitaxially deposited a mono-crystalline insulating film of aluminum silicate continuing the grid structure of the silicon.

The present invention is based on the problem of realizing an integrated circuit containing several electrical function stages, in which the individual function stages are separated with respect to one another galvanically and capacitively not by using pn-junctions which are biased in the reverse direction, but are separated from one another by highly-insulating layers. According to the invention this is accomplished in that the individual electrical function stages of the circuit which are in need of a mutual decoupling, are accommodated each in one thin silicon layer which has grown epitaxially on an insulating film of aluminum silicates, with this silicon layer being separated from the respective next silicon layer by each time one insulating film of like composition which, in turn, has grown epitaxially on the respective preceding silicon layer.

The connections among the individual function stages are effected with the aid of channels extending through the insulating films and filled with silicon likewise applied epitaxially.

By employing the highly-insulating films of aluminum silicates there are achieved the advantages of the epitaxy on corundum by avoiding the disadvantages thereof which are to be seen in the difficult technology of the corundum as well as in the lower economical value thereof. In an advantageous further embodiment of the idea of invention there results a spatial enlargement of the possibilities for accommodating the components in that the silicon substrate contains the components which are common to several function stages, and which are not subjected to the strict insulation requirements of the components forming part of the individual function stages.

Appropriately, the terminals for the supply voltage may be led to the silicon substrate.

The terminals supplying or transferring the intelligence signal or the control criteria, however, will be provided appropriately on the insulating film covering the top silicon layer.

BRIEF DESCRIPTION OF THE DRAWING

The single drawing shows a sectional view of one embodiment of the invention.

DESCRIPTION OF THE PREFERRED EMBODIMENT

On a semiconductor substrate or base 1 of purest silicon there has grown epitaxially an insulating film 2 of aluminum silicates continuing the grid structure of the silicon. The aluminum silicate consists of approximately a minimum of 85% $Al_2O_3$ and of about a maximum of 15% $SiO_2$.

This insulating film, in turn, serves as the base for an epitaxially applied and, therefore, mono-crystalline thin silicon layer 3. This silicon layer 3, and subsequent layers 3*a*, 3*b* etc., contains the passive and active components 7 (resistors 8, diodes 9 and transistors 10) as manufactured in accordance with well-known methods, of one function stage of the multi-stage integrated circuit. This function stage in the layer 3 is galvanically and capacitively decoupled with respect to the silicon base 1, as well as with respect to the function stage as accommodated in the silicon layer 3*a* as positioned thereabove, by each time one mono-crystalline insulating film 2 or 2*a* respectively. The connections which are necessary for transmitting the intelligence signal and the supply voltage among the individual silicon layers 3, 3*a*, 3*b*, etc. is effected by the conducting channels 4 extending through the insulating films 2, 2*a*, 2*b*, etc. These conducting channels 4 may already be left free during the process of growth of the surrounding insulating film 2, 2*a*, 2*b* etc. During the subsequent application of the respective silicon layer positioned thereabove, i.e. 3, 3*a*, 3*b*, etc., these channels are filled with a mono-crystalline and, if so required, correspondingly doped silicon, thus representing, if so required, a low-ohmic (low resistant) connection among the individual stages.

The silicon base or substrate 1 suggests itself as being suitable for accommodating those of the integrated circuit elements which are provided in common to several stages and, therefore, do not need to satisfy the insulation requirements of the individual stages. This will mostly refer to the power supply elements, and the like. In this case it may be appropriate to attach also the terminals 5 for the power supply and ground to the silicon base or substrate 1.

The terminals 6 applying or conducting the intelligence signal or control criteria respectively, however, will be provided most suitably on the insulating film 2*c* covering the top silicon layer 3*b*.

By the inventive multiple-sandwiching of monocrystalline semiconducting and mono-crystalline insulating material it is possible to achieve an electronic packaging density of components which has hitherto been impossible to achieve in any other arrangement. The multistage integrated circuit according to the invention represents a modern device presenting some analogy or resemblance to the well-known micromodule technique, which, however, contains the connections among the individual function stages at the boundary surfaces of the ceramic circuit boards piled on top of each other. In distinction to the micromodule technique, the invention is concerned with a block which is mono-crystalline from the silicon base or substrate up to the top insulating layer consisting of aluminum silicate.

What is claimed is:

1. An integrated circuit arrangement comprising:

a silicon substrate serving as a base crystal;

a first mono-crystalline insulating film of aluminum silicate epitaxially deposited on said substrate;

several monocrystalline silicon layers successively epitaxially deposited over said first film, each layer containing individual electrical function stages;

other successive intermediate mono-crystalline insulating films of aluminum silicate separating each silicon layer to provide mutual decoupling between said individual electrical function stages of said successive layers, all of said films having channels extending therethrough; and epitaxially grown silicon filling said channels to provide for electrical connections between different electrical stages on said successive silicon layers.

2. An integrated circuit according to claim 1, wherein said silicon substrate contains the components which are provided in common to several stages, said common components includes power supply elements.

3. An integrated circuit according to claim 1, wherein the top silicon layer is covered by one of said aluminum silicate films, and the terminals serving the application or the transfer of the intelligence signal or the control criteria respectively, are provided on the insulating film covering the top silicon layer.

4. An integrated circuit according to claim 1, wherein the terminals for the supply voltage are led to said silicon substrate.

References Cited

UNITED STATES PATENTS

| | | | |
|---|---|---|---|
| 3,409,483 | 11/1968 | Watson | 148—175 |
| 3,077,511 | 2/1963 | Bohrer et al. | 174—68.5 |

JOHN W. HUCKERT, Primary Examiner

B. ESTRIN, Assistant Examiner

U.S. Cl. X.R.

317—101, 234; 148—175